United States Patent
Basin et al.

(10) Patent No.: US 11,043,619 B2
(45) Date of Patent: Jun. 22, 2021

(54) LED MODULE WITH HIGH NEAR FIELD CONTRAST RATIO

(71) Applicant: Lumileds LLC, San Jose, CA (US)

(72) Inventors: Grigoriy Basin, San Francisco, CA (US); Anton Belyaev, Milpitas, CA (US); Lex Kosowsky, San Jose, CA (US); Yi Shyan Goh, Bayan Lepas (MY)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/469,913

(22) PCT Filed: Dec. 8, 2017

(86) PCT No.: PCT/EP2017/082018
§ 371 (c)(1),
(2) Date: Jun. 14, 2019

(87) PCT Pub. No.: WO2018/108734
PCT Pub. Date: Jun. 21, 2018

(65) Prior Publication Data
US 2019/0326488 A1 Oct. 24, 2019

Related U.S. Application Data

(60) Provisional application No. 62/434,680, filed on Dec. 15, 2016.

(30) Foreign Application Priority Data

Jan. 6, 2017 (EP) ..................................... 17150551

(51) Int. Cl.
*H01L 33/36* (2010.01)
*H01L 33/56* (2010.01)
(Continued)

(52) U.S. Cl.
CPC .......... *H01L 33/56* (2013.01); *H01L 25/0753* (2013.01); *H01L 33/483* (2013.01);
(Continued)

(58) Field of Classification Search
CPC ......... H01L 33/56; H01L 33/60; H01L 33/50; H01L 25/0753; H01L 33/483;
(Continued)

(56) References Cited

U.S. PATENT DOCUMENTS

| | | | |
|---|---|---|---|
| 2009/0302236 A1* | 12/2009 | Vogt ................... | C09K 11/7705 250/461.1 |
| 2013/0113010 A1 | 5/2013 | Brunner et al. | |

(Continued)

FOREIGN PATENT DOCUMENTS

| | | |
|---|---|---|
| EP | 2709175 A1 | 3/2014 |
| EP | 2998991 A1 | 3/2016 |

(Continued)

OTHER PUBLICATIONS

European Search Report corresponding to EP17150551.4, dated Jun. 26, 2017, 7 pages.
(Continued)

*Primary Examiner* — Dung A. Le

(57) ABSTRACT

A light emitting diode module comprising: at least one light emitting diode structure, an integrated reflector arrangement that comprises a reflector surface for reflecting light from a light emitting area of the light emitting diode structure. The integrated reflector arrangement further comprises a back reflection surface for diffusely reflecting light emitted via a side surface of the light emitting diode structure back to the light emitting diode structure. The back reflection surface is directly attached to at least a part of the side surface such that during operation of the light emitting diode module an emission of stray light by means of the side surface is (Continued)

reduced. The invention finally describes a flash module, an automotive front lighting or a projection light emitting diode system comprising at least one light emitting diode module.

17 Claims, 4 Drawing Sheets

(51) Int. Cl.
  *H01L 25/075* (2006.01)
  *H01L 33/48* (2010.01)
  *H01L 33/50* (2010.01)
  *H01L 33/60* (2010.01)

(52) U.S. Cl.
  CPC .............. *H01L 33/50* (2013.01); *H01L 33/60* (2013.01); *H01L 2933/005* (2013.01); *H01L 2933/0041* (2013.01); *H01L 2933/0058* (2013.01); *H01L 2933/0091* (2013.01)

(58) Field of Classification Search
  CPC ....... H01L 2933/0041; H01L 2933/005; H01L 2933/0091
  See application file for complete search history.

(56) References Cited

U.S. PATENT DOCUMENTS

| | | |
|---|---|---|
| 2013/0307004 A1 | 11/2013 | Weidner et al. |
| 2014/0239325 A1* | 8/2014 | Andrews ............ H01L 25/0753 257/98 |
| 2015/0188004 A1 | 7/2015 | Ozeki et al. |
| 2015/0316215 A1* | 11/2015 | Togawa ................ H01L 33/505 362/231 |
| 2018/0138378 A1* | 5/2018 | Hung ...................... H01L 33/56 |
| 2018/0175265 A1* | 6/2018 | Kim ...................... H01L 33/504 |
| 2019/0027662 A1* | 1/2019 | Saputra ................ H01L 33/505 |
| 2019/0273357 A1* | 9/2019 | Hatano ................... H01L 24/72 |
| 2020/0241391 A1* | 7/2020 | Butterworth ............ H01L 33/60 |

FOREIGN PATENT DOCUMENTS

| | | |
|---|---|---|
| TW | 201327931 A | 7/2013 |
| TW | 201403888 A | 1/2014 |
| WO | 2013061228 A1 | 5/2013 |
| WO | 2016009088 A1 | 1/2016 |
| WO | 2016066476 A1 | 5/2016 |

OTHER PUBLICATIONS

International Search Report from the EPO as the ISA, PCT/EP2017/062018, dated Mar. 9, 2018, 6 pages.

Written Opinion from the EPO as the ISA, PCT/EP2017/062018, dated Mar. 9, 2018, 8 pages.

* cited by examiner

LED MODULE WITH HIGH NEAR FIELD CONTRAST RATIO

FIELD OF THE INVENTION

The invention relates to a LED module with high near field contrast ratio. The invention further relates to a method of manufacturing LED modules with high near field contrast ratio. The invention finally relates to a lighting device such as a flash module, an automotive front lighting (headlight) or a projection light emitting diode system comprising at least one light emitting diode module.

BACKGROUND OF THE INVENTION

High near field contrast requirement of light emitting diode (LED) modules is becoming increasingly important for glare-free luminaires imaging optics design. Near-filed contrast strongly depends on individual chip and package layout.

SUMMARY OF THE INVENTION

It is an object of the present invention to provide an LED module with high near field contrast ratio. It is a further object to provide an improved method of manufacturing LED modules with high near field contrast ratio.

The invention is described in the independent claims. The dependent claims comprise preferred embodiments.

According to a first aspect a method of manufacturing a light emitting diode module is provided. The method comprises the steps of:
 arranging at least one light emitting diode structure on a carrier structure,
 enclosing the at least one light emitting diode structure by means of a mold chase in a cavity such that the light emitting area of the at least one light emitting diode structure is covered by a protection surface,
 providing a fluid molding compound in the cavity such that at least a part of a side surface of the light emitting diode structure is covered by the fluid molding compound and such that a reflector surface for reflecting light emitted via a light emitting area of the light conversion structure of the at least one light emitting diode structure is formed,
 hardening the molding compound such that a back reflection surface is directly attached to the part of the side surface of the light emitting diode structure such that during operation of the light emitting diode module an emission of stray light by means of the side surface of the light emitting diode structure is reduced or even suppressed.

The protection surface may be comprised by the mold chase.

The fluid molding compound may preferably be pressed in the cavity. The cavity may preferably be evacuated prior to pressing the fluid molding compound in the cavity. A pressure in the cavity may preferably be lower than 1 Pa during providing the fluid molding compound. The light emitting diode module described above may therefore be preferably be manufactured by means of a transfer molding process such that the integrated reflector arrangement consists of one piece of material produced by means of the transfer molding process. Subsequent cleaning of the light emitting area or light emitting areas may be avoided by the protection surface in order to avoid any damage of the integrated reflector arrangement.

According to a further aspect a light emitting diode module is provided. The light emitting diode module comprises:
 at least one light emitting diode structure,
 an integrated reflector arrangement, wherein the integrated reflector arrangement comprises a reflector surface for reflecting light emitted via a light emitting area of the at least one light emitting diode structure, wherein the integrated reflector arrangement further comprises a back reflection surface for diffusely reflecting light emitted via a side surface of the light emitting diode structure back to the light emitting diode structure, and wherein the back reflection surface is directly attached to at least a part of the side surface of the light emitting diode structure such that during operation of the light emitting diode module an emission of stray light by means of the side surface of the light emitting diode structure is reduced or even suppressed.

Typically, there are few ways to encapsulate sidewalls especially of flip chip LEDs. The most typical are dispense process and overmolding processes are being used to encapsulate sidewalls of LED source with high light reflectivity material. Excess coating material in case of overmolding is removed from the light emitting area of the LED source by means of sand blasting. Experiments have shown that the side coat and the subsequent sand blasting cause stray light and therefore insufficient near-filed contrast. Additionally, an increased etendue could be caused by the increased surface area due to the exposed side walls of the phosphor layer and/or the light scattered or reflected from the submount. In case of the dispense process the increased etendue can be caused by meniscus of the dispense material at the side wall and besides that the control over the material flow is difficult. All mentioned factors result in stray light, which is detrimental for applications, such as flash modules, automotive front lighting or projection LED systems.

The light emitting diode module described above and below may help to reduce stray light and avoid an increased etendue.

The at least one light emitting diode structure comprises a light emitting diode die and a light conversion structure. The light conversion structure may be attached to a light emitting side of the light emitting diode die. The light emitting area of the at least one light emitting diode structure may be a surface of the light conversion structure.

The light conversion structure may be a plate of converter material which is usually attached to a light emitting surface of the light emitting diode (LED) die. The light emitting surface of the LED die is in case of a flip chip LED die the upper surface of the LED die which is arranged away from the electrical contacts (see FIG. 1). The integrated reflector arrangement encompasses the at least one light emitting diode (LED) structure such that essentially no light can leave the LED structure via the side surfaces of the light conversion structure and the side surfaces of the LED die. The back reflection surface is in direct contact with the LED structure and therefore directly attached to the side surface of the LED structure. The LED structure may comprise one side surface (e.g. a round LED structure) or more than one side surfaces (e.g. four in the case of a rectangular LED structure). The material and the thickness of the material encompassing the LED structure are chosen that a halo of light around the light emitting area is avoided. The integrated reflector arrangement consists of one piece of material at partly embedding the LED structure.

The integrated reflector arrangement is preferably arranged such that a surface of the integrated reflector arrangement around the light emitting area (e.g. upper surface of the light conversion structure) is at least at the same level as the light emitting area. The integrated reflector arrangement may, for example, be arranged such that the upper surface of the light conversion structure (light emitting area) and the part of the integrated reflector arrangement directly around the light emitting area(s) build one common flat surface. The flat area around the light emitting area(s) avoids that any part of the side surface(s) of the LED structure and especially the light conversion structure are exposed such that light can directly be emitted via such a part of the side surfaces of the LED structure. Furthermore, the integrated reflector arrangement enables to arrange the reflector surface or reflector surfaces in proximity to the light emitting area(s).

The integrated reflector arrangement is preferably arranged to provide a sharp luminance cut-off outside of the light emitting area of the light conversion structure of the at least one light emitting diode structure such that during operation of the light emitting diode module a near field contrast is at least 150, preferably at least 200 and more preferably at least 250.

The near field contrast is calculated as a ratio of median luminescence of LEA (light emitting area) and the median luminescence in the line 150 μm away from the edge of LEA.

Contrast=Erred_LEA/Emed_150 um.

The sharp luminance cut-off outside of the light emitting area simplifies subsequent manipulation of the light emitted by the light emitting diode module by means of optical device(s) comprised by a light source comprising one or more of such light emitting diode modules. The high near field contrast of at least 150 avoids glare which may be caused by a halo around the light emitting area. The high near field contrast may further limit light emitted at large angles which cannot be used in the lighting application.

The back reflection surface is preferably characterized by a reflectivity of at least 95%.

The back reflection surface encompasses at least a part of the side surfaces of the light emitting diode structure such that stray light is essentially avoided which can escape from the light emitting diode module in the half sphere above the light emitting area(s). The high reflectivity of at least 95% or even 99% suppresses stray light and reflects the light emitted via the side surfaces especially the side surfaces of the light conversion structure diffusely back to the light emitting diode structure. Diffuse reflection may enable that at least a part of this light is recycled and escapes via the light emitting area(s).

The back reflection surface may extend at least to a level of the at least one light emitting area as described above. The back reflection surface may especially extend beyond the level of the light emitting area(s) such that the light emitting diode structure and especially the light emitting area(s) are enclosed by reflector surfaces being perpendicular to the light emitting area(s). The reflector surfaces are arranged to diffusely reflect light emitted via the light emitting area(s) such that depending on the height of the reflector surfaces above the level of the light emitting area(s) the amount of light at larger angles with respect to an optical axis perpendicular to the light emitting area(s) may be reduced. The height of the reflector surfaces above the level of the light emitting area(s) may be, for example, 500 μm. The height may depend on the size of the light emitting area or areas surrounded by the reflector surfaces.

The integrated reflector arrangement may comprise a material comprising silicone resin loaded with oxide particles. The oxide particles may comprise at least one oxide chosen out of the group $SiO_2$, $TiO_2$, $Zr_2O_3$, $Y_2O_3$, $Al_2O_3$.

The oxide particles are embedded in the silicon resin in order to enable high (diffuse) reflectivity of the integrated reflector arrangement. A material like silicone resin enables to use transfer molding in order to manufacture the integrated reflector arrangement. Further materials like oxide fibers or glass fibers may be added in order to increase robustness of the material of the integrated reflector arrangement.

The silicon resin is preferably loaded with a mixture of $SiO_2$ and $TiO_2$.

The content of the oxide particles within the silicon resin is at least 60%, preferably at least 70% and most preferably at least 80%. The content refers to mass fraction or mass percentage of the respective oxide particles or mixture of oxide particles in the silicon resin. The high content of oxide particles in the silicon resin enables high reflectivity of more than 95% of the hardened resin. Especially the mixture of silicon oxide and titanium oxide enable robust materials with a Young modulus of more than 5 GPa enabling sufficient reliability of the integrated reflector arrangement.

The reflector surface may be arranged such that an opening surrounded by the reflector surface at a distance of 100 μm with respect to the at least one light emitting area is smaller than 2 times the light emitting area of the at least one light emitting diode structure. The opening of the reflector surface(s) defines a plane parallel to the light emitting area(s). The opening would have in case of only one light emitting area the same size as the light emitting area if the reflector surfaces (e.g. rectangular light emitting area) extend beyond the level of the light emitting area such that the extension defines the reflector surfaces which are perpendicular to the light emitting area. The opening would independent from the height of the reflector surfaces have in this case the same size as the area of the light emitting area. The ratio between the size of the opening and the size of the light emitting area would in this case be 1. Every flat rim around the light emitting area and an angle between the reflector surfaces and the light emitting area of more than 90° would increase the size of the opening relative to the size of the light emitting area. The same is also valid with respect to an array of light emitting areas. It is therefore preferred to arrange the light emitting diode structures as close as possible to each other in order to decrease the ratio between opening and light emitting area(s).

The light emitting diode module may comprise at least two light emitting diode structures arranged on a submount. The integrated reflector arrangement embeds at least a part of the submount.

Embedding at least a part of the submount may simplify manufacture of a light emitting diode module comprising a multitude of LEDs structures (LED Array).

According to a further aspect a flash module, an automotive front lighting or a projection light emitting diode system is provided. The flash module, automotive front lighting or projection light emitting diode system may comprise at least one light emitting diode module as described above. The lighting devices may comprise two, three, four or more light emitting diode modules as described above.

The reduction of stray light by means of the light emitting diode module described above may be used to improve the light pattern which can be provided by means of any lighting device comprising such a light emitting diode module.

It shall be understood that a preferred embodiment of the invention can also be any combination of the dependent claims with the respective independent claim.

Further advantageous embodiments are defined below.

BRIEF DESCRIPTION OF THE DRAWINGS

These and other aspects of the invention will be apparent from and elucidated with reference to the embodiments described hereinafter.

The invention will now be described, by way of example, based on embodiments with reference to the accompanying drawings.

In the drawings:

FIG. 1 shows a principal sketch of a light emitting diode

FIG. 2 shows a principal sketch of a light emitting diode array

Figure 3:
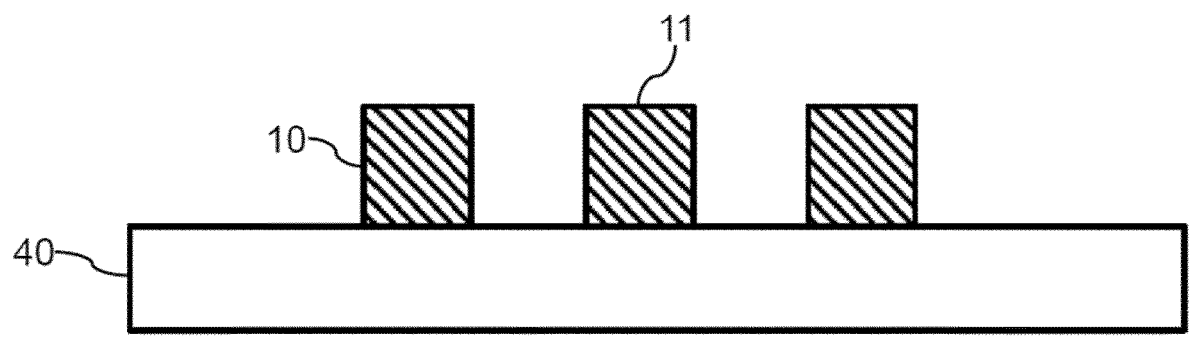
Figure 4:
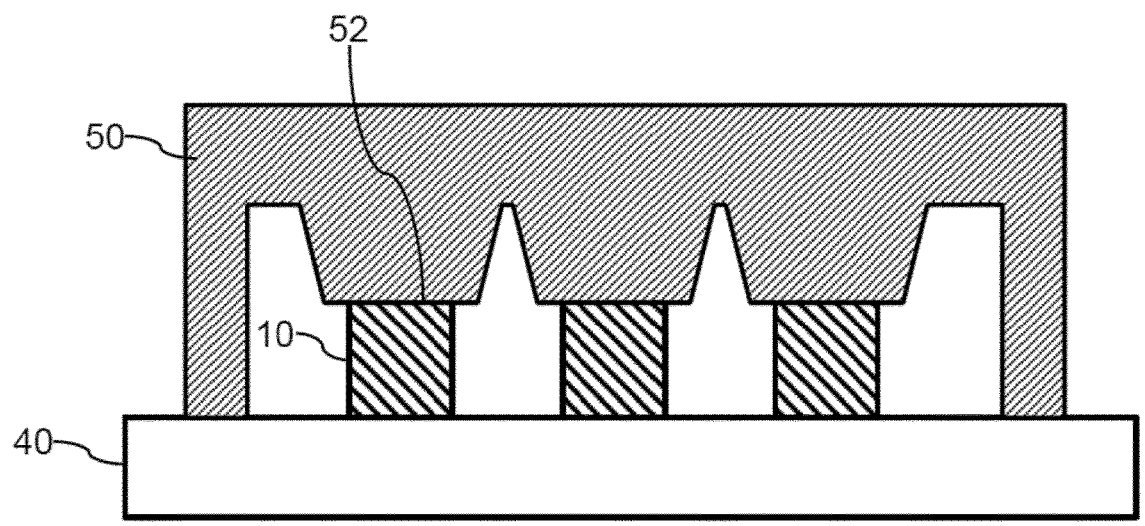
Figure 5:
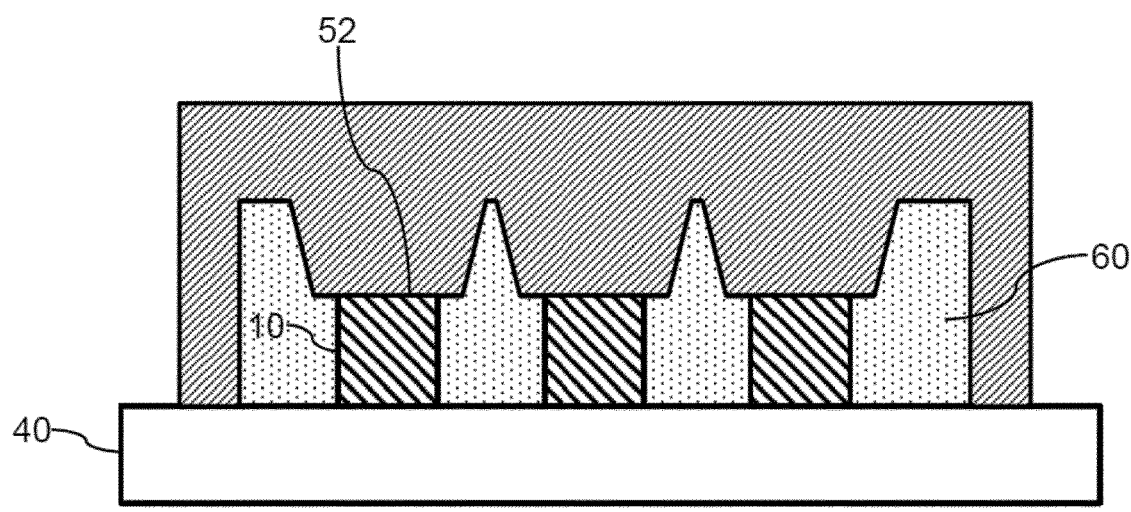
Figure 6:
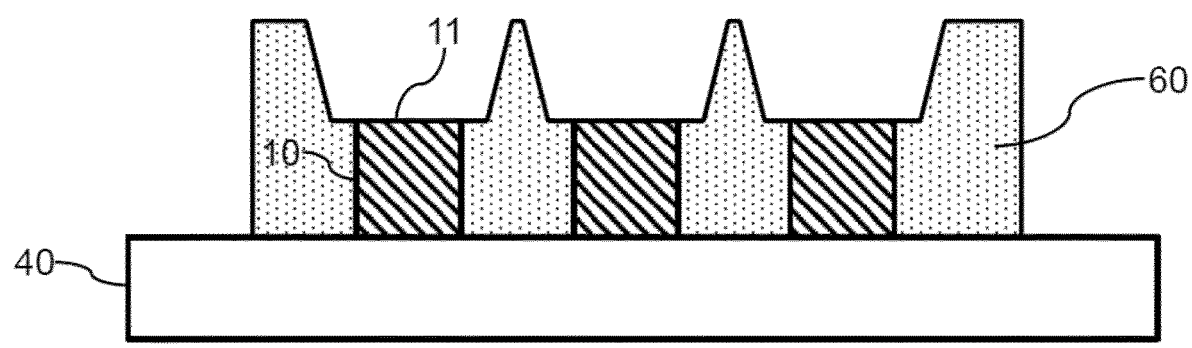
Figure 7:
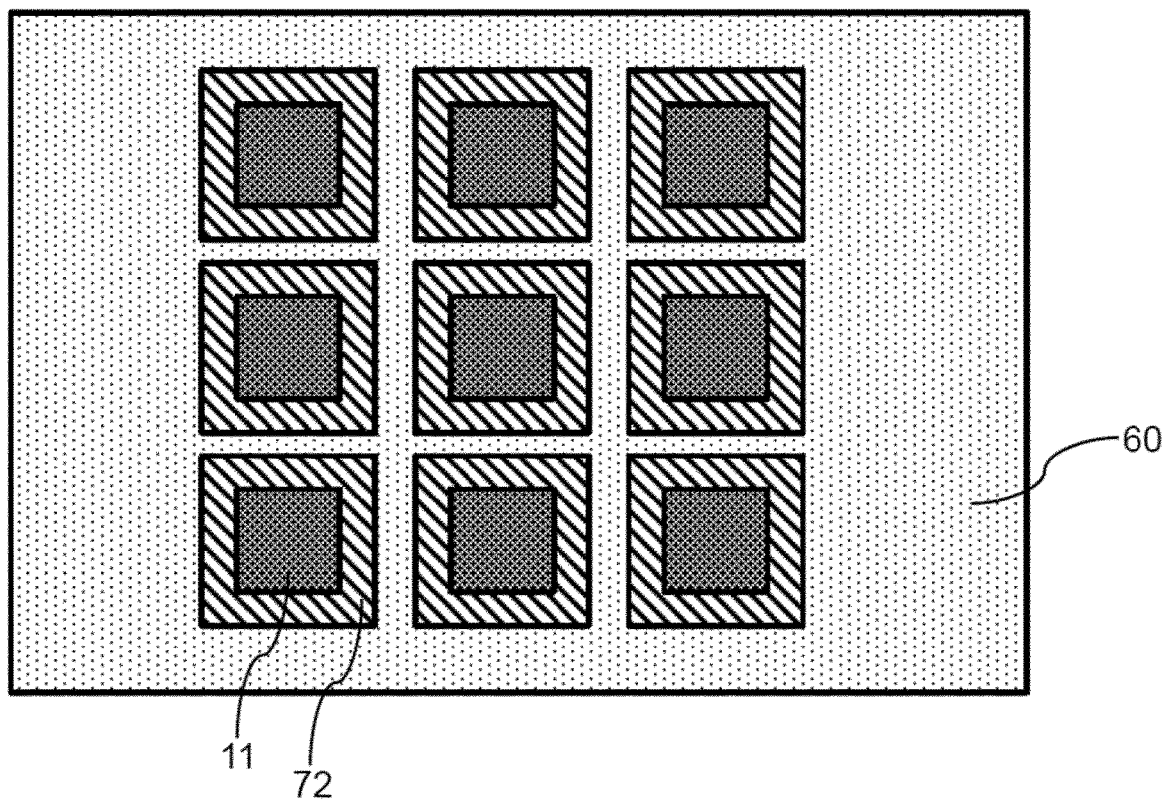
Figure 8:
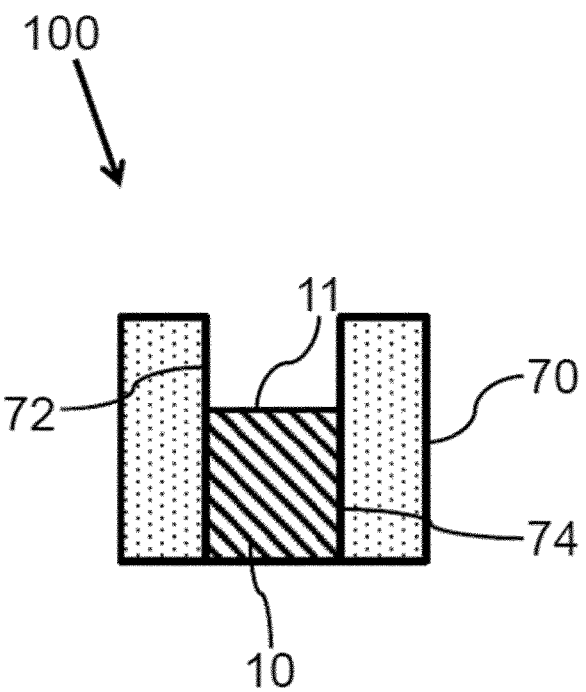
Figure 9:
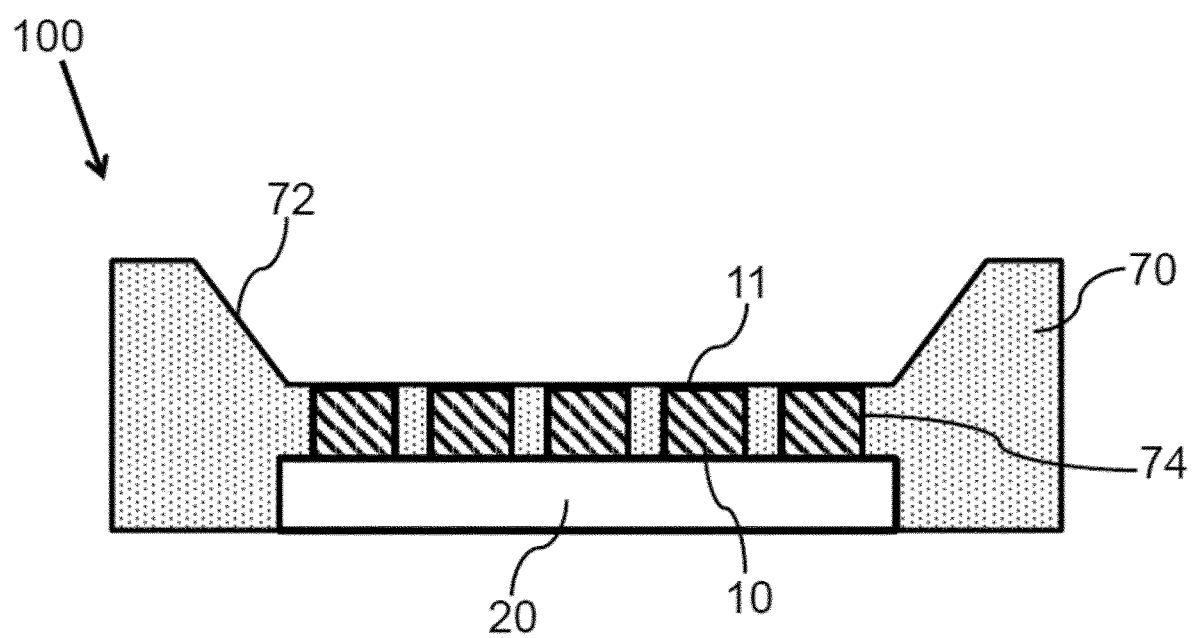

FIG. 3 shows a principal sketch of a first production step of producing a light emitting diode module FIG. 4 shows a principal sketch of a second production step of producing a light emitting diode module FIG. 5 shows a principal sketch of a third production step of producing a light emitting diode module FIG. 6 shows a principal sketch of a fourth production step of producing a light emitting diode module FIG. 7 shows a principal sketch of a top view of an array of light emitting diode modules FIG. 8 shows a first embodiment of a light emitting diode module FIG. 9 shows a second embodiment of a light emitting diode module In the Figures, like numbers refer to like objects throughout. Objects in the Figures are not necessarily drawn to scale.

DETAILED DESCRIPTION OF EMBODIMENTS

Various embodiments of the invention will now be described by means of the Figures.

Figure 1:
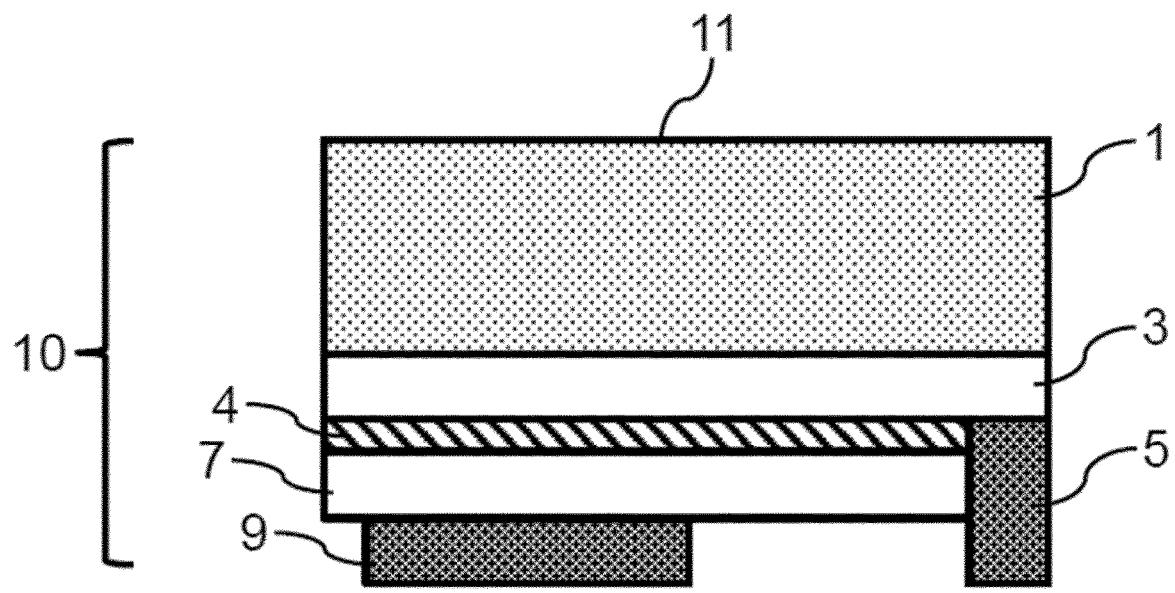

FIG. 1 shows a principal sketch of a cross-section of a light emitting diode structure (LED) 10. The LED structure 10 comprises a n-layer 3 which can be electrically contacted by means of n-contact 5. The n-layer 3 is followed by active layer 4. The active layer 4 may comprise a Quantum Well structure which is arranged to emit light with a wavelength which is determined by the composition of the active layer (e.g., AlInGaN). The active layer 4 is embedded between the n-layer 3 and a p-layer 7. The p-layer 7 can be electrically contacted by means of p-contact 9. The arrangement of n-layer 3, active layer 4, p-layer 9, n-contact 5 and p-contact 9 build a flip chip LED die. The p-contact and the n-contact are arranged on the same side of the LED die. There may be further support layers which are not shown. A light conversion structure 1 is attached to a top surface of the n-layer 3 which is opposite to the surface of the n-layer 3 attached to the active layer 4. The top surface of the n-layer 3 is the light emitting surface of the LED die. The light conversion structure 1 may comprise a phosphor like a Cerium doped phosphor garnet YAG:Ce. The light conversion structure 1 is arranged to convert primary light (e.g. blue light) emitted by the active layer 4 to secondary light characterized by a longer wavelength than the primary light (e.g. yellow light). The LED structure 10 is arranged to emit at least a major part of the light via a top surface of the light conversion structure 1, wherein the top surface is opposite to the surface of the light conversion structure 1 which is attached to the n-layer 3. The top surface of the light conversion structure 1 is the light emitting area 11 of the LED structure 10. Some light may leak out of the side surfaces of the light conversion structure 1 and even via side surfaces of the active layer 4 and adjacent layers. This leakage of light via the side surfaces of the LED structure 10 may reduce the near field contrast in lighting applications.

Figure 2:
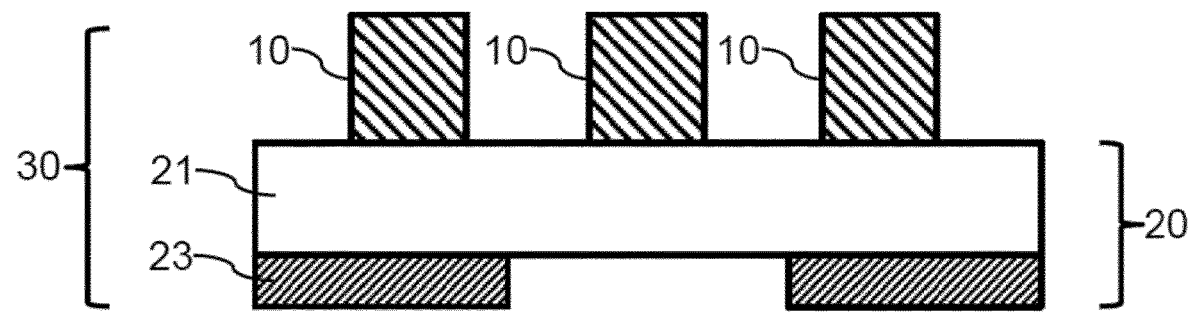

FIG. 2 shows a principal sketch of a cross-section of a light emitting diode array 30. The light emitting diode array 30 comprises a number of LED structures 10 (three are shown in the cross section) attached to a submount 20. The submount 20 comprises a submount chip 21 on which the LED structures 10 are mounted and electrical contact pads 23 by means of which the n-contacts and p-contacts (not shown) of the LED structures 10 can be electrically connected.

FIG. 3 shows a principal sketch of a first production step of producing a light emitting diode (LED) module 100. LED structures 10 are placed on a tape 40 (or any other suitable carrier structure). The LED structures 10 are enclosed in a second production step shown in FIG. 4 by means of the mold chase 50. The mold chase 50 comprises a protection surfaces 52 which are arranged to cover the top surface of the LED structure 10 (light emitting area 11). The mold chase 50 encloses the LED structures 10 on the carrier structure such that there is a cavity around the LED structures 10 providing the form of the integrated reflector arrangement 70. This cavity is evacuated and a fluid molding compound 60 is pressed in the cavity between the tape 40 and mold chase 50. The molding compound 60 comprises in this case a silicon resin which is loaded with a mixture of silicon oxide and titanium oxide particles. The mass fraction or percentage of the oxide particles in the molding compound 60 is in this example 80%. The molding compound 60 is hardened and the mold chase 50 is removed in a fourth processing step shown in FIG. 6. The protection surfaces 52 covered the LED structures 10 and especially the top surfaces of the LED structures 10 which are the light emitting areas 11 of the LED structures 10. No hardened compound material is therefore present on the light emitting areas 11 of the LED structures 10. A subsequent cleaning step of the light emitting areas 11 of the LED structures 10 is therefore avoided. The mold chase 50 and the protection surfaces 52 are arranged such that the hardened material of the molding compound 60 around the LED structures 10 is at least at the same level as the top surfaces of the LED structures 10. The hardened molding compound 60 is arranged such that light emitted by the LED structures 10 is preferably diffusely reflected back to the LED structures 10 in order to enable a second chance of light emission via one of the light emitting areas 11. The reflectivity of the hardened molding compound 60 is in this case 97%. The rest of the light is preferably absorbed by means of the hardened compound material 60 in order to suppress leakage of light around the light emitting areas 11 as much as possible. The flat rim around the light emitting areas is characterized by a width of 200 μm. The near field contrast of this embodiment is 160.

FIG. 7 shows a principal sketch of a top view of an array of light emitting diode modules 100 which have been produced in accordance with the process steps discussed with respect to FIG. 3 to FIG. 6. The hardened molding compound 60 encompasses the light emitting areas 11 of the LED structures 10 such that a part of the hardened molding compound forms reflector surfaces 72 wherein each reflector surface encompasses a respective light emitting area 11. The reflector surfaces 72 enclose an angle of around 80° with the plane parallel to the light emitting areas 11. The reflector surfaces 72 start at a level of the light emitting areas 11 in order to build a reflector around the respective light emitting area 11 for reflecting the light emitted by the light emitting area 11. Bridges between the reflector surfaces 72 enable separation of each LED module 100 by means of, for example, dicing.

FIG. 8 shows a cross-section of a first embodiment of a LED module 100. The LED module 100 was processed in accordance with the transfer molding process as described in FIG. 3 to FIG. 6. The LED module was finally diced from an array of LED modules 100 similar as shown and discussed with respect to FIG. 7. The integrated reflector arrangement 70 consists of the hardened molding compound comprises in this case four back reflection surface 74 encompassing a rectangular LED structure 10. The back reflection surfaces 74 are arranged such that essentially all light emitted via side surfaces of the LED structure 10 is reflected back to the LED structure 10. The integrated reflector arrangement 70 further comprises reflector surfaces 72 which in this case enclose an angle of 90° with a surface parallel to the light emitting area 11. The reflector surfaces 72 are in fact in this case extensions of the back reflection surfaces 74. A height of the reflector surfaces 72 is in this embodiment 300 µm above the level of the light emitting area 11. The opening of the reflector surfaces 72 via which light can escape from the light emitting diode module 100 has in this case at each height of the reflector surfaces 72 the same size as the area size of the light emitting area 11.

FIG. 9 shows a second embodiment of a cross-section of a light emitting diode module 100. The cross section shows five LED structures 10 mounted on a submount 20 which provides the electrical connection of all LED structures 10 mounted on the submount 20. The submount 20 and all LED structures 10 are encompassed by hardened molding compound 60 such that an integrated reflector arrangement 70 is formed wherein reflector surfaces 72 build a reflector for all LED structures 10 mounted on the submount 20 (e.g. an array of 3×5 LED structures 10). The integrated reflector arrangement 70 further comprises back reflection surfaces 74 encompassing each LED structure 10 such that the surface of the integrated reflector arrangement 74 between the LED structures 10 is at the same level as the light emitting areas 11 which are the upper surfaces of the light conversion structure 1 as discussed above. The LED structures 10 are arranged with a distance of 40 µm with respect to each other.

The integrated reflector arrangement 70 may alternatively be processed on top of the submount 20. A multitude of submounts 20 with mounted LED structures 10 may be coupled to each other and a mold chase 50 comprising an array of cavities to build the respective integrated reflector arrangement 70 may be placed on top of the coupled submounts 20. The LED modules 100 each comprising in this case an array of LED structures 10 is processed in essentially the same way as described with respect to FIG. 3 to FIG. 6, wherein the tape is replaced by the coupled submounts 20. The submounts are finally separated in a subsequent processing step.

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

LIST OF REFERENCE NUMERALS 1 light conversion structure
3 n-layer
4 active layer
5 n-contact
7 p-layer
9 p-contact
10 light emitting diode (LED) structure
11 light emitting area
20 submount
21 submount chip
23 electrical contact pads
30 light emitting diode (LED) array
40 tape
50 mold chase
52 protection surface
60 molding compound
700 integrated reflector arrangement
72 reflector surface
74 back reflection surface
100 light emitting diode (LED) module

The invention claimed is:

1. A light emitting diode module comprising:
   at least one light emitting diode structure comprising a light emitting diode die, a wavelength conversion structure attached to the light emitting diode die, a top surface formed by a surface of the wavelength conversion structure and comprising a light emitting area of the light emitting diode structure; an oppositely positioned bottom surface, and at least one side surface connecting the top surface and the bottom surface; and
   an integrated reflector arrangement comprising a reflector surface arranged to reflect light emitted via the light emitting area of the light emitting diode structure and a back reflection surface, the back reflection surface directly attached to at least a part of the side surface of the light emitting diode structure, arranged to diffusely reflect light emitted via the side surface of the light emitting diode structure back to the light emitting diode structure, and extending along the side surface of the light emitting diode structure at least to a level of the light emitting area, the light emitting area of the light emitting diode structure and a part of the integrated reflector arrangement directly around the light emitting area forming one common flat surface.

2. The light emitting diode module according to claim 1, wherein the integrated reflector arrangement is arranged to provide a sharp luminance cut-off outside of the light emitting area of the light emitting diode structure such that during operation of the light emitting diode module a near field contrast is at least 150.

3. The light emitting diode module according to claim 1, wherein the back reflection surface is characterized by a reflectivity of at least 95%.

4. The light emitting diode module according to claim 1, wherein the integrated reflector arrangement comprises a material comprising silicone resin loaded with oxide particles, the oxide particles comprising at least one oxide chosen out of the group $SiO_2$, $TiO_2$, $Zr_2O_3$, $Y_2O_3$, $Al_2O_3$.

5. The light emitting diode module according to claim 4, wherein the silicone resin is loaded with a mixture of $SiO_2$ and $TiO_2$.

6. The light emitting diode module according to claim 4, wherein the content of the oxide particles within the silicone resin is at least 60%.

7. The light emitting diode module according to claim 1, wherein the reflector surface is arranged such that an opening surrounded by the reflector surface at a distance of 100 µm with respect to the level of the light emitting area of the light emitting diode structure is smaller than 2 times the light emitting area of the light emitting diode structure.

8. The light emitting diode module according to claim 1, wherein the reflector surface comprises at least one reflecting area arranged perpendicular to the light emitting area of the light emitting diode structure.

9. The light emitting diode module according to claim 1, wherein the light emitting diode module comprises at least two light emitting diode structures arranged on a submount, wherein the integrated reflector arrangement embeds at least a part of the submount.

10. A system comprising:
a flash module; and
at least one light emitting diode module according to claim 1 disposed in the flash module.

11. A system comprising:
an automotive front lighting system; and
at least one light emitting diode module according to claim 1 disposed in the automotive front lighting module.

12. A system comprising:
a projection light system; and
at least one light emitting diode module according to claim 1 disposed in the projection light system.

13. The light emitting diode module according to claim 1, wherein:
the integrated reflector arrangement is arranged to provide a sharp luminance cut-off outside of the light emitting area of the light emitting diode structure such that during operation of the light emitting diode module a near field contrast is at least 150; and
the back reflection surface is characterized by a reflectivity of at least 95%.

14. The light emitting diode module according to claim 13, wherein the integrated reflector arrangement comprises a material comprising silicone resin loaded a mixture of $SiO_2$ and $TiO_2$.

15. The light emitting diode module according to claim 14, wherein the content of the oxide particles within the silicon silicone resin is at least 60%.

16. The light emitting diode module according to claim 15, wherein the reflector surface is arranged such that an opening surrounded by the reflector surface at a distance of 100 µm with respect to the level of the light emitting area of the light emitting diode structure is smaller than 2 times the light emitting area of the light emitting diode structure.

17. The light emitting diode module according to claim 13, wherein the reflector surface is arranged such that an opening surrounded by the reflector surface at a distance of 100 µm with respect to the level of the light emitting area of the light emitting diode structure is smaller than 2 times the light emitting area of the light emitting diode structure.

* * * * *